United States Patent
Pan et al.

(10) Patent No.: US 9,768,768 B2
(45) Date of Patent: Sep. 19, 2017

(54) FAILSAFE INTERFACE CIRCUIT AND RELATED METHOD

(71) Applicant: Taiwan Semiconductor Manufacturing Company, Ltd., Hsin-Chu (TW)

(72) Inventors: Lei Pan, Shanghai (CN); Qingchao Meng, Shanghai (CN)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 215 days.

(21) Appl. No.: 14/598,113

(22) Filed: Jan. 15, 2015

(65) Prior Publication Data

US 2016/0173081 A1 Jun. 16, 2016

(30) Foreign Application Priority Data

Dec. 15, 2014 (CN) .......................... 2014 1 0776153

(51) Int. Cl.
| | |
|---|---|
| *H02H 9/04* | (2006.01) |
| *H03K 17/16* | (2006.01) |
| *H03K 19/003* | (2006.01) |
| *H03K 19/0185* | (2006.01) |

(52) U.S. Cl.
CPC ........... *H03K 17/165* (2013.01); *H02H 9/045* (2013.01); *H02H 9/046* (2013.01); *H03K 19/00361* (2013.01); *H03K 19/018521* (2013.01)

(58) Field of Classification Search
CPC ........... H03K 17/165; H03K 19/00361; H03K 19/018521
See application file for complete search history.

(56) References Cited

U.S. PATENT DOCUMENTS 5,903,419 A * 5/1999 Smith ................. H01L 27/0251
361/111

* cited by examiner

*Primary Examiner* — Thienvu Tran
*Assistant Examiner* — Tien Mai
(74) *Attorney, Agent, or Firm* — Slater Matsil, LLP (57) ABSTRACT

A device includes a transistor cascode circuit including a first transistor configured to pull up voltage of a bulk and a node in response to a first control signal, and a second transistor configured to pull up voltage of an interface (I/O) pin in response to a second control signal. The device further includes a third transistor configured to pull down voltage of the I/O pin in response to a third control signal, and a feedback circuit configured to turn off the first transistor when the voltage of the I/O pin is above a predetermined level during a failsafe period.

20 Claims, 7 Drawing Sheets

FAILSAFE INTERFACE CIRCUIT AND RELATED METHOD

PRIORITY CLAIM

This application claims priority to Chinese Application No. 201410776153.5 filed Dec. 15, 2014, which application is incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node).

Shrinking the semiconductor process node entails reductions in operating voltage and current consumption of electronic circuits developed in the semiconductor process node. For example, operating voltages have dropped from 5V to 3.3V, 2.5V, 1.8V, and even 0.9V. A wave of mobile device popularity has increased pressure in the industry to develop low power circuits that only drain minimal operating current from batteries that power the mobile devices. Lower operating current extends battery life of battery-operated mobile devices, such as smartphones, tablet computers, ultrabooks, and the like.

Leakage current is an electrical phenomenon that has become increasingly present in designs in deep sub-micron semiconductor process nodes. Leakage current occurs when a transistor is turned on even while performing no function. For example, a transistor that remains on after powering down a circuit the transistor belongs to will induce leakage current. In a power-limited environment, such as a wearable device with a very small battery, lower leakage current translates to longer battery life before needing a recharge.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely failsafe interface (I/O) circuits and related methods. Other embodiments may also be applied, however, to other types of I/O circuits.

Throughout the various figures and discussion, like reference numbers refer to like objects or components. Also, although singular components may be depicted throughout some of the figures, this is for simplicity of illustration and ease of discussion. A person having ordinary skill in the art will readily appreciate that such discussion and depiction can be and usually is applicable for many components within a structure.

In the following disclosure, a novel I/O circuit and method are introduced. The I/O circuit uses a self-biasing floating well to reduce leakage current.

Figure 1:
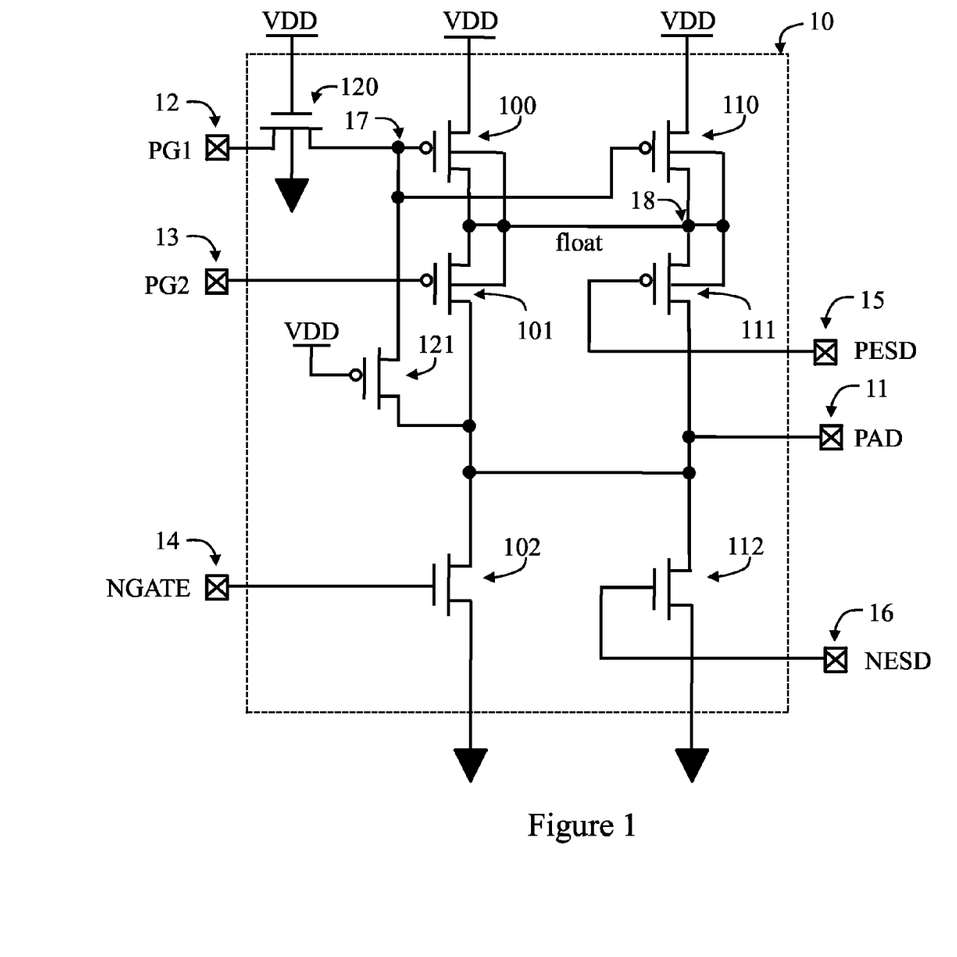
FIG. 1 is a diagram of a failsafe I/O circuit in accordance with one or more embodiments of the present disclosure.

FIG. 1 is a diagram of a failsafe I/O circuit 10 in accordance with one or more embodiments of the present disclosure. The failsafe I/O circuit 10 is electrically coupled to an integrated circuit pad 11 (or simply "pad 11"), and is configured to provide an electrical interface between an external circuit(s) electrically coupled to the pad 11, and an internal integrated circuit in which the failsafe I/O circuit 10 is physically located. In some embodiments, the external circuit(s) and the internal integrated circuit are formed in a single, monolithic integrated circuit chip. Other embodiments in which the external and internal integrated circuits are independent chips in a same package (e.g., an integrated circuit stack, a silicon-on-insulator package) are also contemplated herein.

The failsafe I/O circuit 10 is electrically coupled to other pads 12-16 for receiving various input signals related to operation of the failsafe I/O circuit 10. In some embodiments, each of the other pads 12-16 can be a full integrated circuit pad. Other embodiments in which the other pads 12-16 are simply integrated circuit traces or internal nodes are also contemplated herein. In some embodiments, the other pads 12-16 electrically couple the failsafe I/O circuit 10 to control logic that provides the various input signals related to the operation of the failsafe I/O circuit 10. The input signals and their relation to the operation of the failsafe I/O circuit 10 are described in further detail in the discussion of FIGS. 2-7.

Failsafe conditions (or "modes") may arise during operation of the integrated circuit chip to which the failsafe I/O circuit 10 belongs. A period of time over which the failsafe condition(s) or mode(s) occurs is a failsafe period. In some embodiments, the failsafe I/O circuit 10 described herein is designed to ensure that circuit reliability is maintained, even in the presence of supply voltage failure, or high voltage signal levels at I/O pins. Certain examples of failsafe conditions are identified herein, including: open input pins, idle bus, and shorted input pins.

Transistors 100, 101, 102 of the failsafe I/O circuit 10 form a driver circuit including a cascoded P-type metal-oxide-semiconductor (PMOS) pull-up circuit, and an N-type metal-oxide-semiconductor (NMOS) pull-down circuit. The transistors 100, 101 are electrically coupled to a first voltage supply node, and to the pad 11. The first voltage supply node provides a first voltage VDD in normal operation. In a failsafe mode, the first voltage supply node is floating or grounded. The transistors 100, 101 are both PMOS transistors. A source electrode of the transistor 100 is electrically coupled to the first voltage supply node. A drain electrode of the transistor 100 is electrically coupled to a source electrode of the transistor 101 at a node 18. A drain electrode of the transistor 101 is electrically coupled to the pad 11. The bulk of the transistor 100 and the bulk of the transistor 101 are electrically coupled to the drain electrode of the transistor 100 and the source electrode of the transistor 101 at the node 18. The node 18 is electrically floating. In some embodiments, the bulk of the transistor refers to the substrate in which the transistor is formed (a bulk contact is sometimes referred to as a body contact, a base contact, or a substrate contact). In other embodiments, the bulk of the transistor refers to a doped well in which the transistor is formed, which doped well is formed in the substrate. Contact to a well is still typically referred to as a bulk, a body, a base, or a substrate contact.

A gate electrode of the transistor 100 is electrically coupled to the pad 12 through a transistor 120 when the transistor 120 is turned on. The gate electrode of the transistor 100 is electrically coupled to a source electrode of the transistor 120. A drain electrode of the transistor 120 is electrically coupled to the pad 12. The bulk of the transistor 120 is electrically coupled to the ground. A gate electrode of the transistor 120 is electrically coupled to the first voltage supply node. When the transistor 120 is turned on, and voltage level of a first PMOS gate control signal PG1 at the pad 12 is low, the transistor 100 is turned on. As a non-limiting example for illustration purposes, the transistor 100 is turned on when the first voltage VDD is 1.8 Volts, and the first PMOS gate control signal PG1 is 0 Volts (source-gate voltage $VSG\_100$ is greater than threshold voltage $VTHP\_100$).

A gate electrode of the transistor 101 is electrically coupled to the pad 13. When the voltage level of a second PMOS gate control signal PG2 at the pad 13 is low, and the transistor 100 is turned on, the transistor 101 is turned on. As a non-limiting example for illustration purposes, the transistor 101 is turned on when the first voltage VDD is 1.8 Volts, the first PMOS gate control signal PG1 is 0 Volts (source-gate voltage $VSG\_100$ is greater than threshold voltage $VTHP\_100$), and the second PMOS gate control signal PG2 is 0 Volts (source-gate voltage $VSG\_101$ is greater than threshold voltage $VTHP\_101$). When both of the transistors 100, 101 are turned on, voltage at the pad 11 is pulled up to approach the first voltage VDD.

The voltage at the pad 11 is also configured to be pulled down to a second voltage (e.g., ground) under certain conditions. A transistor 102 provides an electrical path down to the second voltage to the pad 11. When the transistor 102 is turned on, the voltage at the pad 11 is pulled down to approach the second voltage. A drain electrode of the transistor 102 is electrically coupled to the pad 11. A source electrode of the transistor 102 is electrically coupled to the ground. A gate electrode of the transistor 102 is electrically coupled to the pad 14. An NMOS gate control signal NGATE at the pad 14 controls turning on/off of the transistor 102. As a non-limiting example for illustration purposes, when the NMOS gate control signal NGATE is high (e.g., 1.8 Volts), and the second voltage is low (e.g., 0 Volts), the transistor 102 turns on (gate-source voltage $VGS\_102$ is greater than threshold voltage $VTHN\_102$), and pulls pad 11 to the second voltage.

A feedback circuit includes a transistor 121. The transistor 121, when turned on, establishes an electrical connection between the pad 11 and the gate electrode of the transistor 100. When the transistor 121 is turned on, voltage at the gate electrode of the transistor 100 approaches the pad voltage PAD. A drain electrode of the transistor 121 is electrically coupled to the pad 11. A source electrode of the transistor 121 is electrically coupled to the gate electrode of the transistor 100. A gate electrode of the transistor 121 is electrically coupled to the first power supply node.

The failsafe I/O circuit 10 further includes an electrostatic discharge (ESD) protection circuit including transistors 110, 111, 112. The ESD protection circuit protects the failsafe I/O circuit 10 and other circuitry electrically coupled to the failsafe I/O circuit 10 during ESD events.

The transistors 110, 111, 112 provide an electrical path from the first voltage supply node to the second voltage supply node (e.g., ground) through parasitic bipolar junction transistors (BJT) of the transistors 110, 111, 112. A source electrode of the transistor 110 is electrically coupled to the first voltage supply node. A drain electrode of the transistor 110 is electrically coupled to a source electrode of the transistor 111. A gate electrode of the transistor 110 is electrically coupled to the gate electrode of the transistor 100. The bulk of the transistor 110 is electrically floating.

The source electrode of the transistor 111 is electrically coupled to the drain electrode of the transistor 110. A drain electrode of the transistor 111 is electrically coupled to the pad 11. The bulk of the transistor 111 is electrically floating. A gate electrode of the transistor 111 is electrically coupled to the pad 15. The gate electrode of the transistor 111 is controlled by a first ESD signal PESD at the pad 15. When voltage level of the first ESD signal PESD is lower than voltage level of the node 18 by the threshold voltage of the transistor 111, the transistor 111 is turned on, which establishes an electrical connection between the pad 11 and the node 18. The transistor 111 is turned off during normal operation.

A source electrode of the transistor 112 is electrically coupled to the second voltage supply node (e.g., ground). A drain electrode of the transistor 112 is electrically coupled to the pad 11. A gate electrode of the transistor 112 is electrically coupled to the pad 16. The gate electrode of the transistor 112 is controlled by a second ESD signal NESD at the pad 16. When voltage level of the second ESD signal NESD is higher than voltage level of the second voltage supply node (e.g., ground) by the threshold voltage of the transistor 112, the transistor 112 is turned on, which establishes an electrical connection between the pad 11 and the second voltage supply node. The transistor 112 is turned off during normal operation.

Figure 2:
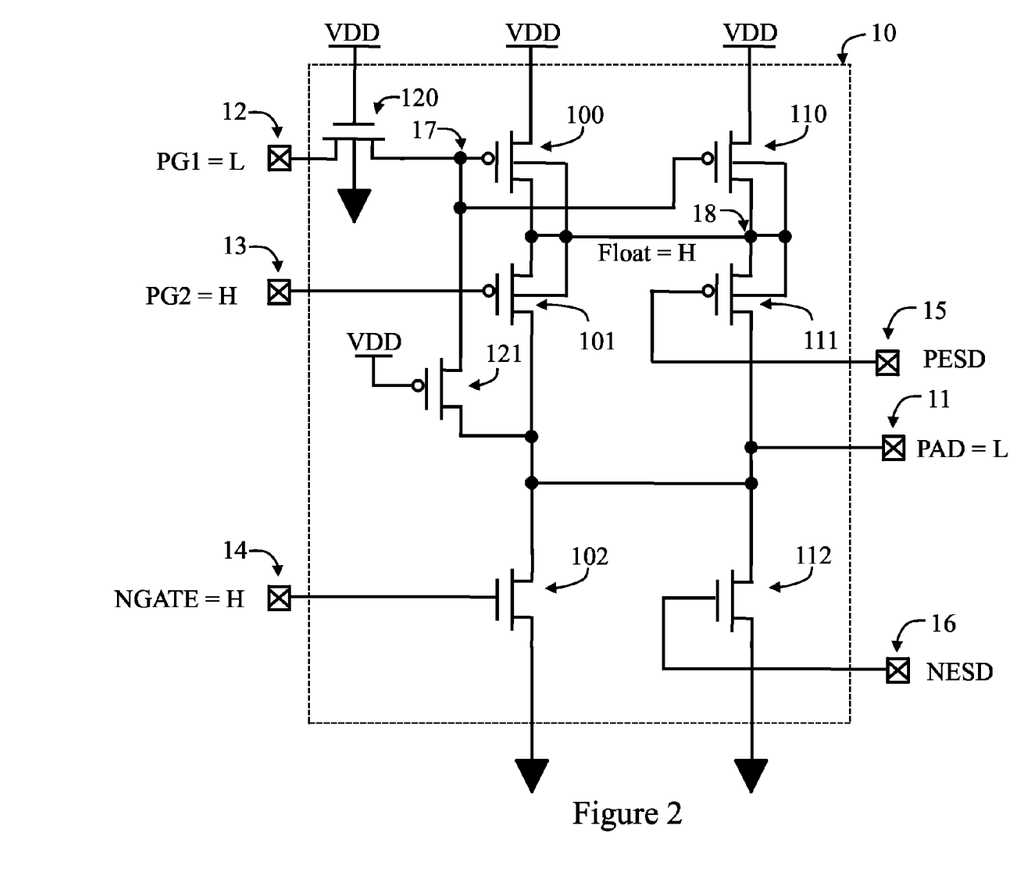
FIG. 2 is a diagram of the failsafe I/O circuit of FIG. 1 in a first operating mode in accordance with one or more embodiments of the present disclosure.

FIG. 2 is a diagram of the failsafe I/O circuit 10 of FIG. 1 in a first operating mode in accordance with one or more embodiments of the present disclosure. For purposes of illustration, voltage levels of electrical nodes shown in FIGS. 2 through 7 are shown as high ("H") or low ("L"). As a non-limiting example, the low voltage level ("L") can be 0 Volts, and the high voltage level ("H") can be greater than about 0.5 Volts. Other embodiments using different values for the low voltage level ("L") and the high voltage level ("H") are also contemplated herein.

The first operating mode is a normal operation mode in which the failsafe I/O circuit 10 acts as an output circuit for outputting an internal signal from an internal circuit to an external circuit (e.g., a core logic circuit to another integrated circuit chip). As a result, the ESD protection circuit including the transistors 110, 111, 112 is disabled (PESD=H, NESD=L). In the first operating mode, the first PMOS gate control signal PG1 is low (e.g., 0 Volts), the second PMOS gate control signal PG2 is high (e.g., 1.8 Volts), and the NMOS gate control signal NGATE is high (e.g., 1.8 Volts).

Gate voltage VG_120 of the transistor 120 is the first voltage VDD, which is high enough to turn on the transistor 120. The transistor 120 being turned on establishes an electrical connection between the pad 12 and the node 17, such that the low voltage level of the first PMOS gate control signal PG1 is established at the gate electrode of the transistor 100. Source-gate voltage VSG_100 of the transistor 100 is high enough to turn on the transistor 100 (VDD−VL>VTHP). The transistor 100 being turned on establishes an electrical connection that pulls up the voltage at the node 18 to the first voltage VDD, less the voltage drop across transistor 100, which is considered minimal or insignificant to operation of the circuit for the purposes of this discussion (in this example, the first voltage VDD is equal to the high voltage level "H"). As a result, the high voltage level VH is established at the bulk of the transistors 100, 101, 110, 111.

The second PMOS gate control signal PG2 is high. With the gate electrode of the transistor 101 controlled by the second PMOS gate control signal PG2, the transistor 101 is turned off (VH−VH<VTHP). The NMOS gate control signal NGATE is high. The transistor 102 controlled by the NMOS gate control signal NGATE is turned on (VH>VTHN). The transistor 102 being turned on establishes an electrical connection between the pad 11 and the second voltage supply node (e.g., ground), which pulls the voltage level of the pad 11 down to approach the voltage level of the second voltage supply node. In the first operating mode, the pad voltage PAD is low.

Figure 3:
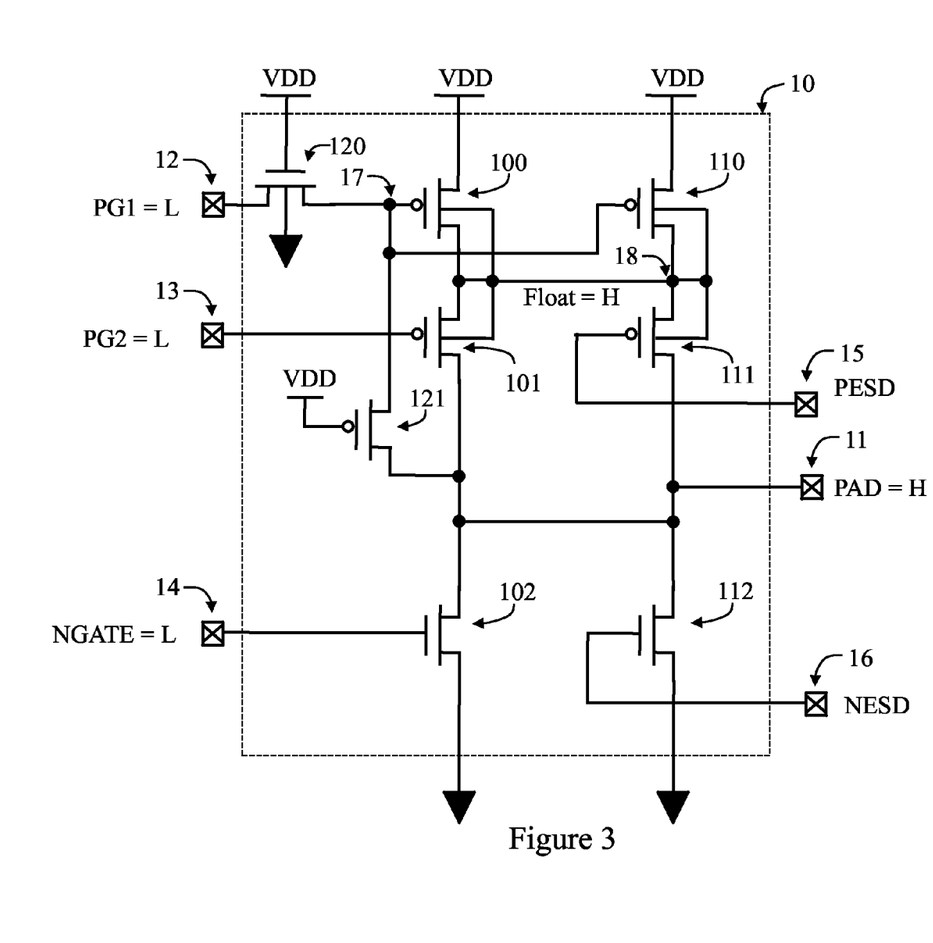
FIG. 3 is a diagram of the failsafe I/O circuit of FIG. 1 in a second operating mode in accordance with one or more embodiments of the present disclosure.

FIG. 3 is a diagram of the failsafe I/O circuit 10 of FIG. 1 in a second operating mode in accordance with one or more embodiments of the present disclosure. The second operating mode is a normal operation mode in which the failsafe I/O circuit 10 acts as an output circuit for outputting an internal signal from an internal circuit to an external circuit (e.g., a core logic circuit to another integrated circuit chip). Like the first operating mode, the ESD protection circuit including the transistors 110, 111, 112 is disabled (PESD=H, NESD=L) in the second operating mode. The first PMOS gate control signal PG1 is low (e.g., 0 Volts), the second PMOS gate control signal PG2 is low (e.g., 0 Volts), and the NMOS gate control signal NGATE is low (e.g., 0 Volts). Gate voltage VG_120 of the transistor 120 is the first voltage VDD, which is high enough to turn on the transistor 120. The transistor 120 being turned on establishes an electrical connection between the pad 12 and the node 17, such that the low voltage level of the first PMOS gate control signal PG1 is established at the gate electrode of the transistor 100. Source-gate voltage VSG_100 of the transistor 100 is high enough to turn on the transistor 100 (VDD−VL>VTHP). The transistor 100 being turned on establishes an electrical connection that pulls up the voltage at the node 18 to the first voltage VDD (in this example, the first voltage VDD is equal to the high voltage level "H"). As a result, the high voltage level VH is established at the bulk of the transistors 100, 101, 110, 111.

The NMOS gate control signal NGATE is low. The transistor 102 controlled by the NMOS gate control signal NGATE is turned off (VL<VTHN). The transistor 102 being turned on electrically isolates the pad 11 from the second voltage supply node (e.g., ground). The second PMOS gate control signal PG2 is low. With the gate electrode of the transistor 101 controlled by the second PMOS gate control signal PG2, the transistor 101 is turned on (VH−VL>VTHP), which pulls the voltage level of the pad 11 up to approach the high voltage level VH. In the second operating mode, the pad voltage PAD is high.

Figure 4:
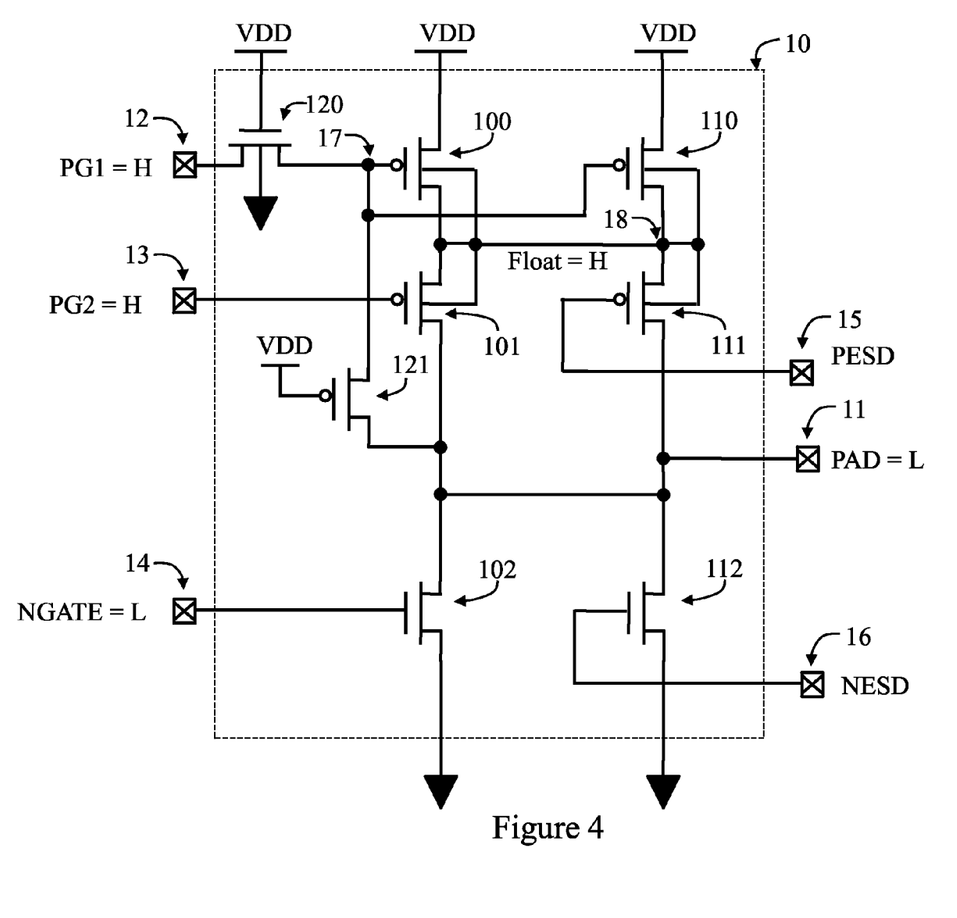
FIG. 4 is a diagram of the failsafe I/O circuit of FIG. 1 in a third operating mode in accordance with one or more embodiments of the present disclosure.

FIG. 4 is a diagram of the failsafe I/O circuit 10 of FIG. 1 in a third operating mode in accordance with one or more embodiments of the present disclosure. The third operating mode is a normal operation mode in which the failsafe I/O circuit 10 acts as an input circuit for inputting an external signal from an external circuit to an internal circuit (e.g., another integrated circuit chip to a core logic circuit). As a result, the ESD protection circuit including the transistors 110, 111, 112 is disabled (PESD=H, NESD=L). In the third operating mode, the first PMOS gate control signal PG1 is high (e.g., 1.8 Volts), the second PMOS gate control signal PG2 is high (e.g., 1.8 Volts), the NMOS gate control signal NGATE is low (e.g., 0 Volts), and the pad voltage PAD is low. Gate voltage VG_120 of the transistor 120 is the first voltage VDD, which is high enough to turn on the transistor 120. The transistor 120 being turned on establishes an electrical connection between the node 17 and the pad 12, such that a voltage level of the first PMOS gate control signal PG1 minus NMOS threshold voltage VTHN is established at the gate electrode of the transistor 100. Source-gate voltage VSG_100 of the transistor 100 is high enough to turn on the transistor 100 (VDD−(VDD−VTHN) VTHP). How strongly or weakly the transistor 100 turns on depends on relative values of the NMOS threshold voltage VTHN and the PMOS threshold voltage VTHP. As one skilled in the art will recognize, the greater the voltage drop across transistor 120, hence the lower the voltage at the gate of transistor 100, the greater the source-gate voltage VSG_100, and hence the more transistor 100 will be turned on. Conversely, the lesser the voltage drop across transistor 120, and hence the higher the voltage at the gate of transistor 100, the lesser the source-gate voltage VSG_100 will be and the less transistor 100 will be turned on. The transistor 100 being turned on establishes an electrical connection that pulls up the voltage at the node 18 to the first voltage VDD (in this example, the first voltage VDD is equal to the high voltage level "H"). As a result, the high voltage level VH is established at the bulk of the transistors 100, 101, 110, 111.

The second PMOS gate control signal PG2 is high. With the gate electrode of the transistor 101 controlled by the second PMOS gate control signal PG2, the transistor 101 is turned off (VH−VH<VTHP). The NMOS gate control signal NGATE is low. The transistor 102 controlled by the NMOS gate control signal NGATE is turned off (VL<VTHN). The transistor 102 being turned off electrically isolates the pad 11 from the second voltage supply node (e.g., ground), allowing pad 11 to be pulled driven low as illustrated, e.g., by an external circuit (not shown) without interference from failsafe I/O circuit 10 when operating in the illustrated input circuit mode.

Figure 5:
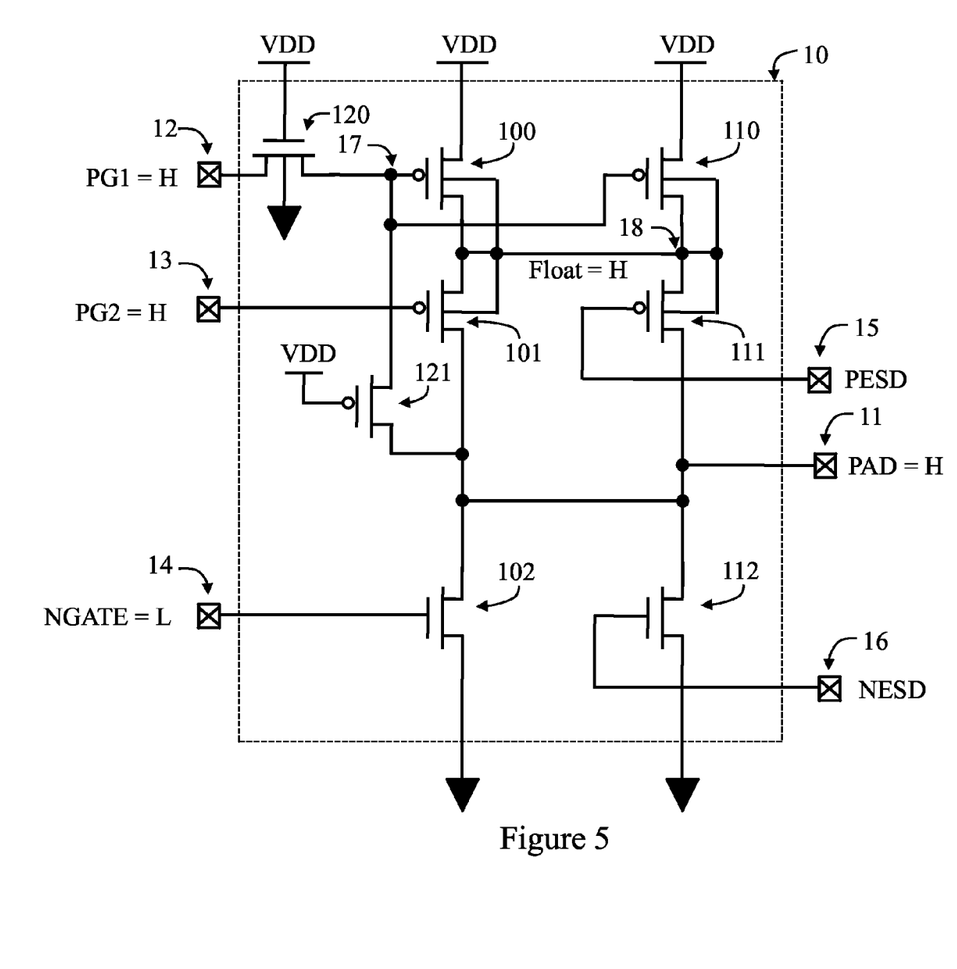
FIG. 5 is a diagram of the failsafe I/O circuit of FIG. 1 in a fourth operating mode in accordance with one or more embodiments of the present disclosure.

FIG. 5 is a diagram of the failsafe I/O circuit 10 of FIG. 1 in a fourth operating mode in accordance with one or more embodiments of the present disclosure. The fourth operating mode is a normal operation mode in which the failsafe I/O circuit 10 acts as an input circuit for inputting an external signal from an external circuit to an internal circuit (e.g., another integrated circuit chip to a core logic circuit). As a result, the ESD protection circuit including the transistors 110, 111, 112 is disabled (PESD=H, NESD=L). In the fourth operating mode, the first PMOS gate control signal PG1 is high (e.g., 1.8 Volts), the second PMOS gate control signal PG2 is high (e.g., 1.8 Volts), the NMOS gate control signal NGATE is low (e.g., 0 Volts), and the pad voltage PAD is high. Gate voltage VG_120 of the transistor 120 is the first voltage VDD, which is high enough to turn on the transistor 120. The transistor 120 being turned on establishes an electrical connection between the node 17 and the pad 12, such that a voltage level of the first PMOS gate control signal PG1 minus NMOS threshold voltage VTHN is established at the gate electrode of the transistor 100. Source-gate voltage VSG_100 of the transistor 100 is high enough to turn on the transistor 100 (VDD−(VDD−VTHN) VTHP). How strongly or weakly the transistor 100 turns on depends on relative values of the NMOS threshold voltage VTHN and the PMOS threshold voltage VTHP. The transistor 100 being turned on establishes an electrical connection that pulls up the voltage at the node 18 to the first voltage VDD (in this example, the first voltage VDD is equal to the high voltage level "H"). As a result, the high voltage level VH is established at the bulk of the transistors 100, 101, 110, 111.

The second PMOS gate control signal PG2 is high. With the gate electrode of the transistor 101 controlled by the second PMOS gate control signal PG2, the transistor 101 is turned off (VH−VH<VTHP). The NMOS gate control signal NGATE is low. The transistor 102 controlled by the NMOS gate control signal NGATE is turned off (VL<VTHN). The transistor 102 being turned off electrically isolates the pad 11 from the second voltage supply node (e.g., ground) allowing pad 11 to be pulled driven high as illustrated, e.g., by an external circuit (not shown) without interference from failsafe I/O circuit 10 when operating in the illustrated input circuit mode.

Figure 6:
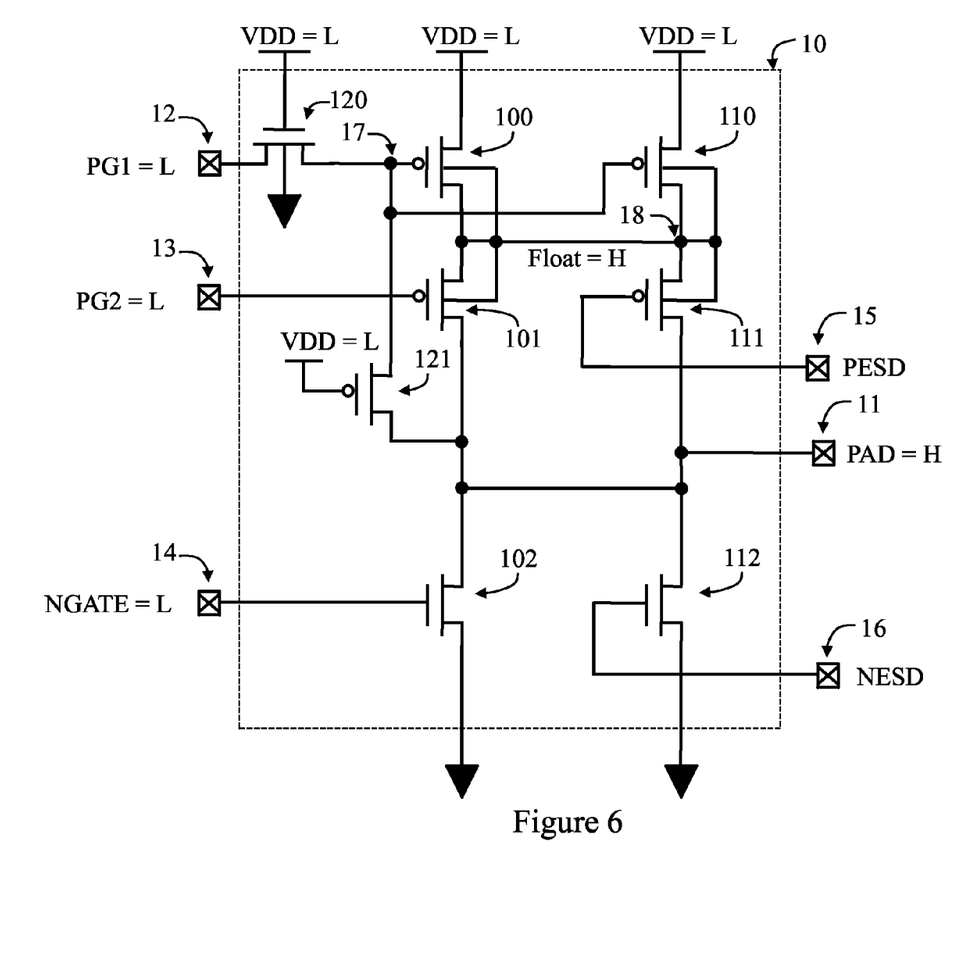
FIG. 6 is a diagram of the failsafe I/O circuit of FIG. 1 in a failsafe operating mode in accordance with one or more embodiments of the present disclosure.

FIG. 6 is a diagram of the failsafe I/O circuit 10 of FIG. 1 in a fifth operating mode in accordance with one or more embodiments of the present disclosure. The fifth operating mode is a failsafe operating mode, in which the failsafe I/O circuit 10 is powered down (VDD=L, PG1=L, PG2=L, NGATE=L). In some failsafe modes, a high voltage level (e.g., 1.8 Volts) can arise at the pad 11. Various design measures are included in the failsafe I/O circuit 10 that eliminate, or at least mitigate, leakage current that could arise from movement in the pad voltage PAD.

The gate electrode of the transistor 121 is electrically coupled to the first voltage supply node, and is ideally grounded when the first voltage supply node is low. As a result, when the pad voltage PAD is high during the failsafe operating mode, the transistor 121 is turned on (VH−VL>VTHP). The transistor 121 being turned on establishes an electrical connection between the pad 11 and the gate electrode of the transistor 100 over which the high voltage level of the pad 11 can be established at the gate electrode of the transistor 100. The low voltage level at the source electrode of the transistor 100 and the high voltage level at the gate electrode of the transistor 100 means that source-gate voltage VSG_100 of the transistor 100 is negative, which keeps the transistor 100 turned off.

The second PMOS gate control signal PG2 is at the low voltage level in the failsafe operating mode. In the presence of the pad voltage PAD, which is high, the transistor 101 is turned on (VH−VL>VTHP). The transistor 101 being turned on establishes an electrical connection between the pad 11 and the bulk of the transistors 100, 101, 110, 111. As a result, voltage level of the bulk of the transistors 100, 101, 110, 111 is charged to the high voltage level (e.g., 1.8 Volts).

Figure 7:
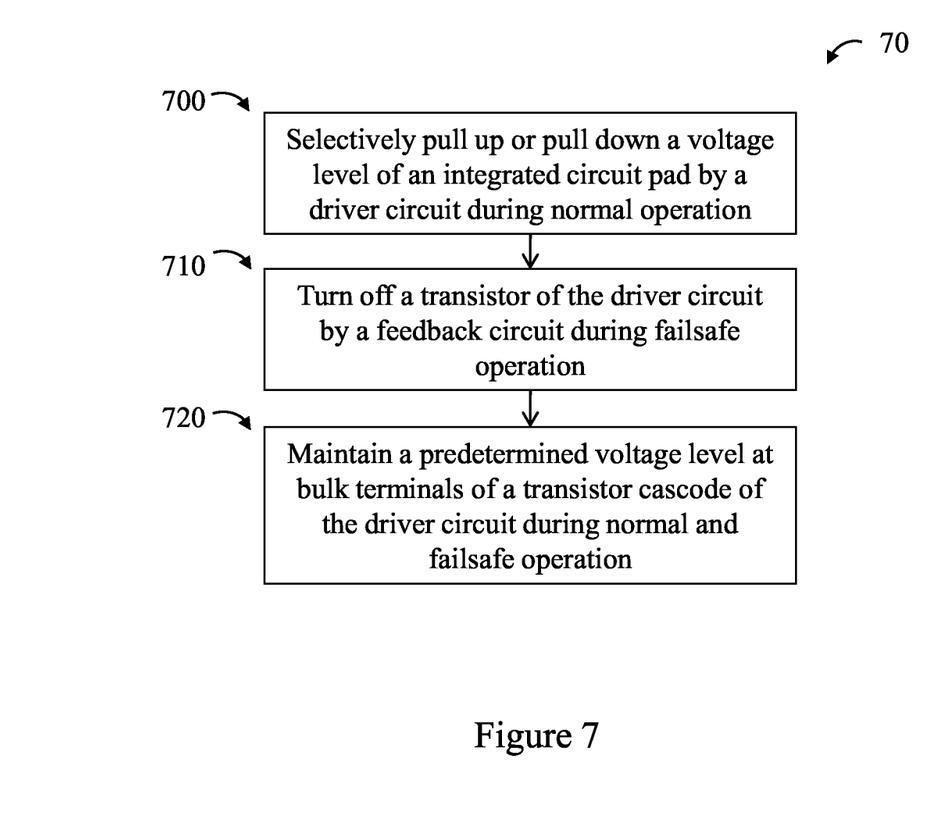
FIG. 7 is a flowchart of a method of operating the failsafe I/O circuit of FIG. 1 in accordance with one or more embodiments of the present disclosure.

FIG. 7 is a flowchart of a method 70 of operating the failsafe I/O circuit 10 in accordance with one or more embodiments of the present disclosure. The method 70 is described in terms of the failsafe I/O circuit 10 of FIGS. 1-6. Other I/O circuits that employ the method 70 are also within the scope of the disclosure.

During normal operation, the pad voltage PAD is selectively pulled up or down by the driver circuit that includes the transistors 100, 101, 102 in operation 700. The pad voltage PAD is pulled up by the transistors 100, 101, or pulled down by the transistor 102. In normal operation, the first voltage VDD is high (e.g., 1.8 Volts). The pad voltage PAD is pulled up when the signals PG1, PG2, NGATE are low (e.g., 0 Volts). The pad voltage PAD is pulled down when the signals PG1, PG2 are high.

In failsafe operation, the first voltage VDD is low (e.g., 0 Volts). The transistor 100 is turned off by the transistor 121 in operation 710. The transistor 121 is a PMOS transistor, and is turned on when the first voltage VDD is low. When the pad voltage PAD is high (e.g., 1.8 Volts), the high voltage pulls up voltage at the gate electrode of the transistor 100. The transistor 100 is a PMOS transistor, and is turned off when the voltage at its gate electrode is high.

In failsafe operation or normal operation, voltage of the bulk terminals of transistors 100, 101 of the PMOS cascode is held at a predetermined voltage level (e.g., 1.8 Volts) in operation 720. In failsafe operation, the pad voltage PAD pulls up the voltage of the bulk terminals through conductance by the turned-on transistor 101. In some embodiments, the pad voltage PAD further pulls up the voltage of the bulk terminals of the transistors 110, 111.

Embodiments may achieve advantages. The failsafe I/O circuit 10 uses a self-biased floating N-well design that does not require floating PMOS control. The circuit 10 further includes independent gate control of the post-driver PMOS transistors 100, 101. Failsafe operation is robust, with little to no leakage current, due to elimination of feedback from the pad 11. The failsafe I/O circuit 10 is also readily applicable to multi-drive-type applications, without requiring additional multi-drive related floating PMOS devices.

In accordance with one or more embodiments of the present disclosure, a device includes a transistor cascode circuit including a first transistor configured to pull up voltage of a bulk and a node in response to a first control signal, and a second transistor configured to pull up voltage of an interface (I/O) pin in response to a second control signal. The device further includes a third transistor configured to pull down voltage of the I/O pin in response to a third control signal, and a feedback circuit configured to turn off the first transistor when the voltage of the I/O pin is above a predetermined level during a failsafe period.

In accordance with one or more embodiments of the present disclosure, a device includes a driver circuit configured to pull up a pad voltage of a pad in response to a first control signal and a second control signal, or pull down the pad voltage in response to a third control signal. The device further includes an electrostatic discharge (ESD) protection circuit electrically coupled to the pad and the driver circuit, and a feedback circuit configured to establish a voltage above a predetermined level at bulks of transistors of the driver circuit and the ESD protection circuit.

In accordance with one or more embodiments of the present disclosure, a method includes selectively pulling up or pulling down a voltage level of an integrated circuit (IC) pad by a driver circuit electrically coupled to the IC pad during normal operation; turning off a transistor of the driver circuit by a feedback circuit electrically coupled to the driver circuit and the IC pad during failsafe operation; and maintaining a predetermined voltage level at bulk terminals of a transistor cascode of the driver circuit during the normal operation and the failsafe operation.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Moreover, the term "between" as used in this application is generally inclusive (e.g., "between A and B" includes inner edges of A and B).

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a transistor cascode circuit including:
      a first transistor configured to pull up a bulk voltage in response to a first control signal; and
      a second transistor configured to pull up an interface (I/O) pin voltage in response to a second control signal, the second control signal being a different signal from the first control signal; and
      a third transistor configured to pull down the I/O pin voltage in response to a third control signal, the third control signal being a different signal from the first and second control signals; and
   a feedback circuit configured to generate a feedback signal, the feedback signal configured to control the first transistor based on the I/O pin voltage, the feedback signal being different from the first, second and third control signal.

2. The device of claim 1, wherein the feedback circuit is configured to turn off the first transistor when the I/O pin voltage is above a predetermined level.

3. The device of claim 1, wherein the feedback circuit comprises:
   a fourth transistor configured to:
   increase gate voltage of the first transistor during a failsafe period when the I/O pin voltage is above a predetermined level; and
   be turned off outside the failsafe period.

4. The device of claim 3, wherein the fourth transistor has:
   a source electrode electrically coupled to a gate electrode of the first transistor; and
   a drain electrode electrically coupled to the I/O pin.

5. The device of claim 1, further comprising:
   an electrostatic discharge (ESD) protection circuit coupled to the I/O pin.

6. The device of claim 5, wherein the ESD protection circuit includes:
   a fifth transistor and a sixth transistor coupled between the I/O pin and a first voltage supply node; and
   a seventh transistor coupled between the I/O pin and a second voltage supply node.

7. The device of claim 6, wherein the sixth transistor is configured to couple the I/O pin to the first voltage supply node in response to a first ESD control signal; and
   the seventh transistor is configured to couple the I/O pin to the second voltage supply node in response to a second ESD control signal.

8. The device of claim 1, wherein the bulk is a doped well region in a semiconductor substrate.

9. A device comprising:
   a pad including a pad voltage;
   a driver circuit including a plurality of transistors configured to:
      pull up the pad voltage in response to at least one of a first control signal and a second control signal; and
      pull down the pad voltage in response to a third control signal;
   an electrostatic discharge (ESD) protection circuit coupled to the pad and the driver circuit; and
   a feedback circuit coupled to the driver circuit and the ESD protection circuit configured to control voltages of the driver circuit and the ESD protection circuit based on the pad voltage.

10. The device of claim 9, wherein the feedback circuit controls the respective voltages of the plurality of transistors of the driver circuit to be above a predetermined level.

11. The device of claim 9, wherein:
   the driver circuit includes a first transistor cascoded with a second transistor configured to pull up the pad voltage, the first transistor receiving the first control signal and the second transistor receiving the second control signal, and a third transistor configured to pull down the pad voltage, the third transistor receiving the third control signal.

12. The device of claim 11, wherein the first and second transistors are PMOS transistors and the third transistor is an NMOS transistor.

13. The device of claim 11, further comprising a bulk contact for each of the first and second transistors and wherein the bulk contacts for each of the first and second transistors are coupled together.

14. The device of claim 11, wherein the first transistor is configured to maintain a bulk voltage for the first and second transistor at a pre-determined level.

15. The device of claim 9, wherein the driver circuit includes at least one PMOS device having a bulk contact and the ESD circuit includes at least one second PMOS device having a second bulk contact, the bulk contact and second bulk contact being electrically coupled together.

16. The device of claim 9, wherein:
   the driver circuit includes
      a first transistor having a first terminal connected to a first voltage supply node, a second terminal connected to a bulk region, a third terminal coupled to a control node through a gating transistor, and a bulk terminal connected to the bulk region,
      a second transistor having a first terminal connected to the third and bulk terminals of the first transistor, a second terminal connected to a second control node, a third terminal connected to the pad, and a bulk terminal connected to the bulk region, and
      a third transistor having a first terminal connected to the pad, a second terminal connected to a third control node, and a third terminal connected to a second voltage supply node; and
   the feedback circuit includes a fourth transistor having a first terminal connected to the second terminal of the first transistor, a second terminal connected to the first voltage supply node, and a third terminal connected to the pad.

17. A method comprising:
selectively pulling up or pulling down a voltage level of an integrated circuit (IC) pad by a driver circuit electrically coupled to the IC pad during normal operation;
turning off a transistor of the driver circuit by a feedback circuit electrically coupled to the driver circuit and the IC pad during failsafe operation based on the voltage level of the IC Pad; and
maintaining a predetermined voltage level at bulk terminals of a transistor cascode of the driver circuit during the normal operation and the failsafe operation.

18. The method of claim 17, wherein the step of maintaining a predetermined voltage level at bulk terminals of a transistor cascode of the driver circuit during the normal operation and the failsafe operation includes:
coupling the bulk terminals of the transistor cascode to a first voltage supply node through a first transistor of cascode.

19. The method of claim 17, wherein the step of selectively pulling up or pulling down a voltage level of an integrated circuit (IC) pad by a driver circuit electrically coupled to the IC pad during normal operation includes:
coupling the pad to a first voltage supply node through a first transistor and second transistor of the driver circuit, in response to a first control signal, and
coupling the pad to a second voltage supply node through a third transistor of the driver circuit, in response to another control signal.

20. The method of claim 17, further comprising:
maintaining a predetermined voltage level at bulk terminals of an electrostatic discharge circuit connected to the pad.

* * * * *